United States Patent
Apte et al.

(10) Patent No.: US 9,773,081 B2
(45) Date of Patent: Sep. 26, 2017

(54) ANALYTIC MODEL LIFECYCLE MAINTENANCE AND INVALIDATION POLICIES

(75) Inventors: Chidanand Apte, Chappaqua, NY (US); Brenda Dietrich, Yorktown Heights, NY (US); Kevin McAuliffe, Yorktown Heights, NY (US); Bonnie Ray, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 1194 days.

(21) Appl. No.: 12/831,661

(22) Filed: Jul. 7, 2010

(65) Prior Publication Data

US 2012/0011082 A1    Jan. 12, 2012

(51) Int. Cl.
*G06F 7/00* (2006.01)
*G06F 17/50* (2006.01)

(52) U.S. Cl.
CPC ................... *G06F 17/504* (2013.01)

(58) Field of Classification Search
CPC ............... G06F 17/504; G06F 11/3452; G06F 11/3612; G06F 2201/86; G06F 2216/03
USPC .......................... 707/690, 694, 702
See application file for complete search history.

(56) References Cited

U.S. PATENT DOCUMENTS

| | | | | |
|---|---|---|---|---|
| 8,527,624 B2 * | 9/2013 | Chen | ................... | G06F 11/3466 709/223 |
| 8,725,859 B2 * | 5/2014 | White | .................... | H04L 67/16 709/223 |
| 2002/0184133 A1 * | 12/2002 | Zangari et al. | .................. | 705/36 |
| 2004/0098265 A1 * | 5/2004 | Kelly et al. | .................... | 704/270 |
| 2004/0215396 A1 * | 10/2004 | Christie | ................... | G01V 1/28 702/14 |
| 2008/0027782 A1 | 1/2008 | Freire et al. | | |
| 2008/0195650 A1 * | 8/2008 | Lingenfelder et al. | ........ | 707/102 |
| 2009/0037363 A1 * | 2/2009 | Kozlov et al. | .................... | 707/1 |

OTHER PUBLICATIONS

Ludascher et al., Concurrency and Computation: Practice and Experience, The First Provenance Challenge, Apr. 2008, pp. 507-518, vol. 20, No. 5, abstract only, http://portal.acm.org/citation.cfm?id=1350745.1350754&coll=&dl=.

Buneman et al., Data Provenance: Some Basic Issues, http://db.cis.upenn.edu/DL/fsttcs.pdf.

Schwartz, How It could have prevented the financial meltdown, InfoWorld, Sep. 24, 2008, http://www.infoworld.com/article/08/09/24/39NF-it-financial-meltdown_1.html.

* cited by examiner

*Primary Examiner* — Cheyne D Ly
(74) *Attorney, Agent, or Firm* — Scully, Scott, Murphy & Presser, P.C.; Daniel P. Morris

(57) ABSTRACT

A governing modeling system maintains information associated with an analytic model. One or more policies may be defined that are associated with the analytic model and one or more instances of the analytic model. The system may monitor the analytic model and the one or more instances of the analytic model based on at least some of the information, the one or more policies associated with the analytic model and the one or more policies associated with the one or more instances of the analytic model.

21 Claims, 3 Drawing Sheets

ANALYTIC MODEL LIFECYCLE MAINTENANCE AND INVALIDATION POLICIES

FIELD

The present disclosure is generally related to analytical modeling, and more particularly to governance of modeling systems.

BACKGROUND

An analytic model includes an analytic component (with associated metadata containing information such as a description of the analytic technique used, assumptions required for the analytic technique to be valid, constraints and sensitivities), the definition of the type of data on which the model operates, and a definition of the output the model produces. The analytical component can be built using a variety of techniques, including, but not limited to, mathematical modeling, statistical modeling and data mining. Mathematical modeling can be used when the problem is sufficiently well understood (being expressed, for example, as a solution to the equations used to describe changes in a system) and often requires only a modest amount of input data. Statistical modeling is used when the general mathematical structure can be hypothesized using domain knowledge and analysis of moderate amounts of data. Data mining is used when the mathematical structure is completely unknown and a large amount of data is required to infer both structure and parameters for the model.

A model instance is the execution of a model on a particular input set and producing an output based on those inputs. For any model, it may have hundreds of model instances depending on the frequency with which the model is executed. How long the output of a model instance is considered valid is dependent on a number of factors, included, but not limited to the frequency with which the input data changes and the amount of quantitative change in the input data. If the analytic component of a model is revised, then a new version of the model is said to be created. Model instances for this (new) model are generated when the new version is executed.

Generally in the current practice, the inputs and assumptions upon which a model is defined, both within an enterprise and across enterprises are not recorded and maintained in a coherent fashion. Often, who is permitted to make changes to an analytic component and when changes are permitted is not strictly enforced or tracked. Moreover, the data and metadata used in the execution of a model that creates a particular model instance are not recorded and maintained with the instance. This lack of provenance tracking can lead to incorrect decision making or as time passes, good decisions turning into incorrect ones because analysis is not updated as baseline assumptions or input data that drove the original results of a particular model or model instance are no longer valid. The lack of provenance tracking also can result in incorrect assessment of risk, as a set of successive analytic models is employed, each based on results of an instance of a previous model where input data and assumptions are unknown or not fully understood.

BRIEF SUMMARY

A method for governing a modeling system, in one aspect, may include collecting information associated with an analytic model and one or more instances of the analytic model. The method may also include defining one or more policies associated with the analytic model and defining one or more policies associated with the one or more instances of the analytic model. The method may further include monitoring the analytic model and the one or more instances of the analytic model based on at least some of the collected information, the one or more policies associated with the analytic model and the one or more policies associated with the one or more instances of the analytic model.

A system for governing analytic models, in one aspect, may include a storage device operable to store information associated with an analytic model and one or more instances of the analytic model. The storage device may be further operable to store one or more policies associated with the analytic model and one or more policies associated with one or more instances of the analytic model. A monitoring module may be operable to monitor the analytic model and the one or more instances of the analytic model based on at least some of the stored information, the one or more policies associated with the analytic model and the one or more policies associated with the one or more instances of the analytic model.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Governance of modeling systems provides tools, mechanisms and methods for managing the integrity of analytical systems and improving the integrity of the systems that rely on the results of the analytical system on an on-going basis. For instance, mechanisms can be created that record and maintain the provenance of an analytic model, its analytic component(s) and any model instances. Policies associated with the use and revision of analytic models can be defined. A system can be built to implement and enforce the policies, enabling the management of the lifecycle changes of the analytic models, including the analytic component, data and assumptions. Similarly, policies can be defined and enforced for model instances using the same system.

Maintaining policies for models and policies for model instances provides greater levels of governance and flexibility by enabling coordinated and/or independent management at the model level and at the model instance level. Since a single model can have multiple model instances (each instance, for example, being generated from different input data), a set of policies can be defined for managing the model and/or a set of policies can be defined to manage all of its model instances and/or a sets of policies can be defined to manage groups of its model instances and/or sets of policies can be defined to manage individual model instances. For example, consider a model that predicts the amount of new residential home construction based on inputs such as: the current month of year, interest rates, cost of key construction materials, and unemployment rate. A set of policies can be defined for the model so that at the start of each month all model instances are automatically invalidated and the model is automatically reevaluated with current inputs. Another set of policies can be defined to invalidate particular model instances and to reevaluate the model only for those invalidated instances, for example, one or more model instances whose cost of key construction material change more than 5% within a month.

Figure 1:
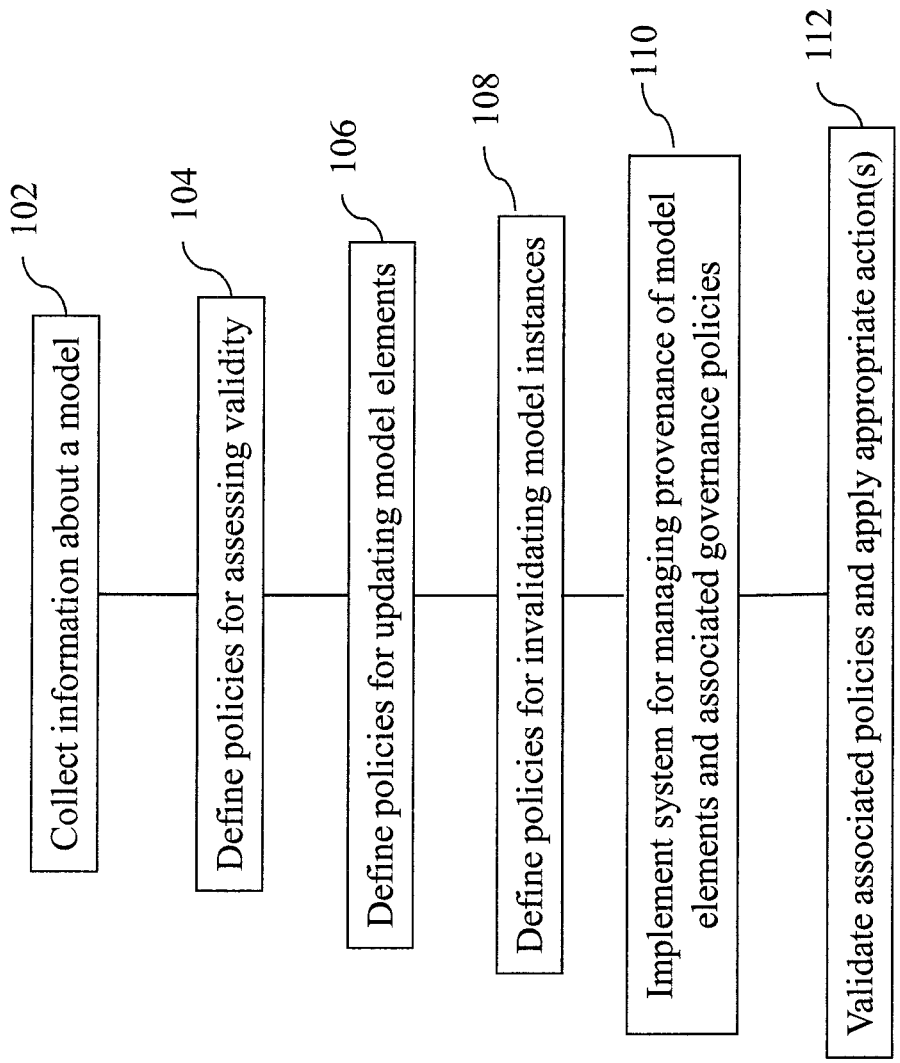
FIG. 1 is a flow diagram illustrating a method of governing modeling systems and model instances in one embodiment of the present disclosure.

FIG. 1 is a flow diagram illustrating a method of governing modeling systems in one embodiment of the present disclosure. At 102, information about a model is collected. The collected information may include elements associated with the model, for example, elements related to analytic component(s) for the model, data-related elements associated with the model, and assumptions associated with the model.

Elements related to the analytic component of the model may include, for example, model attributes such as the model name, author(s), version of model, description of model, description of results, model parameter values, model sensitivity to changes in one or more model parameters, and others. Data-related elements associated with the model may include, but are not limited to, names and descriptions of model input variables, names and descriptions of model output variables, sources of input data, data characteristics (e.g., data set size necessary for valid results), locations of output data, trust factor associated with input data. Assumption-related model elements may include, but are not limited to design criteria, for example, types of input for which the model was designed. Examples include, but are not limited to, Gaussian input, categorical input, input having less than a percentage, e.g., <5% missing values, and others.

At 104, policies may be defined for assessing validity of analytic procedure, where validity may be assessed based on elements of the model, data, or model assumptions, although not limited to those elements only. Such policies can be used to ensure that the model is being used with valid data and in a valid context. Examples of a validity policy may include, but are not limited to: one or more rules to check the currency of the data (e.g. "input data is not valid if the input data is more than 3 months old"); one or more rules to verify that the uncertainly of the input data is within acceptable bounds; statistical procedure such as a Chi-squared Goodness-of-Fit test to determine whether data satisfies model assumptions; and one or more rules to verify that the amount of input data complies for the requirements of the analytic procedure. Policies can also be specified which aid in model selection given output requirements. For example, for a given input data set, a model using classification tree may be selected over a logistic model if a higher degree of accuracy is required. Any of the policies may include one or more actions to be taken if validity checks pass or fail. For example, an action may be an automatic replacement of a model with another one that provides more accurate result. An action may be an error event generation if a model uses a data set too small for the analytic procedure of the model being used.

At 106, policies may be defined for updating model elements, if necessary, where update step includes, editing or replacing an analytic element of the model, and/or changing associated data and/or model assumptions. For example, one or more rules can be specified to verify the who, how and when model elements can be modified as well as what to do if unauthorized changes are attempted or what to do if an unauthorized changed model is used. As policies at 104 can be used to verify that a model is used appropriately, policies at 106 can be used to manage the life cycle of the model.

At 108, policies may be defined for specifying criteria for invalidating said one or more instances of the analytic model, e.g., when and how model instances, either individual instances or collections of instances can be or should be invalidated. An example policy for invalidating a model instance is a policy that invalidates a model instance when one or more of the inputs that were used to generate the model instance have changed more than a given percentage. Actions may be defined as part of the policies for invalidating model instances. Example actions could be causing the model to be re-executed, creating a new model instance, and sending notification all users or programs that relied on the now invalidated model instance. Another example of a model instance policy and/or policies are one which specifies that a model instance becomes invalid after a given period of time (e.g. twenty-four hours).

The policies at 104, 106 and 108 are specified, in general, by those responsible for managing the life cycle of the models and model instances. Although the steps for specifying these policies are given in this embodiment in a specific order, other orderings are possible. Moreover, the number of policies can be added to and/or diminished at any time, and policies can be updated and/or enhanced over time as needed. Policies can also be created programmatically, for example, the same set of policies can be created for all model instances of a given model, perhaps, differing by some parameters such as validity duration.

At 110, a system may be implemented to enable management of model element provenance, for example tracking when changes to model elements are made and by whom; and the provenance of the governance policies, for example tracking when changes to policies are made and by whom. The provenance can be recorded when changes are made to a model element or a governance policy by using logging features that are typically part of a database system, such as DB2™, a relational model database server developed by International Business Corporation, Armonk, N.Y.

At 112, validation of associated policies may be enabled. For example, a data quality component may generate and execute a code such as a Structured Query Language (SQL) code to test for and identify potential data quality problems. An assumption monitoring component may generate and execute SQL code to monitor model assumptions on an ongoing basis. Analytic monitoring component may generate and execute SQL code to monitor model quality on an ongoing basis. Model refresh component may initiate model refresh process (a process that updates a model with a new version or replaces it with another model) if model quality degrades below acceptable levels. Timers can be used to invalidate model instance results after some specified length of time (for example, specified by a policy in 108).

An example use case may be illustrated by a scenario in which a portfolio of mortgages is rated. Based on that rating they are purchased. Shortly after the acquisition, a model input, housing prices, changes from an assumption of 10% year to year increase to flat or downward. This change in assumptions may be detected automatically with the governance system and method of the present disclosure and may automatically execute a re-evaluation of the portfolio. Moreover, events signals can be sent to programs or users that have relied on the model instance results. A variant of the use case is for the prospective purchaser to examine the provenance of model assumptions and inputs, and request a recalculation if there are substantive changes in the model assumptions and/or inputs.

Another example use case may be illustrated by a scenario in which a supply chain management system includes a demand forecasting component, based on assumption that historical demands in some Week t are linearly related to orders placed in a previous week, Week t-k, for some time window of k, i.e. a linear regression function is used to generate demand forecasts. Company A switches to a new ordering policy, in which it places all orders the first week of each quarter. The governance system and method of the present disclosure may automatically identify that a linear regression model is no longer valid and request a model update.

Figure 2:
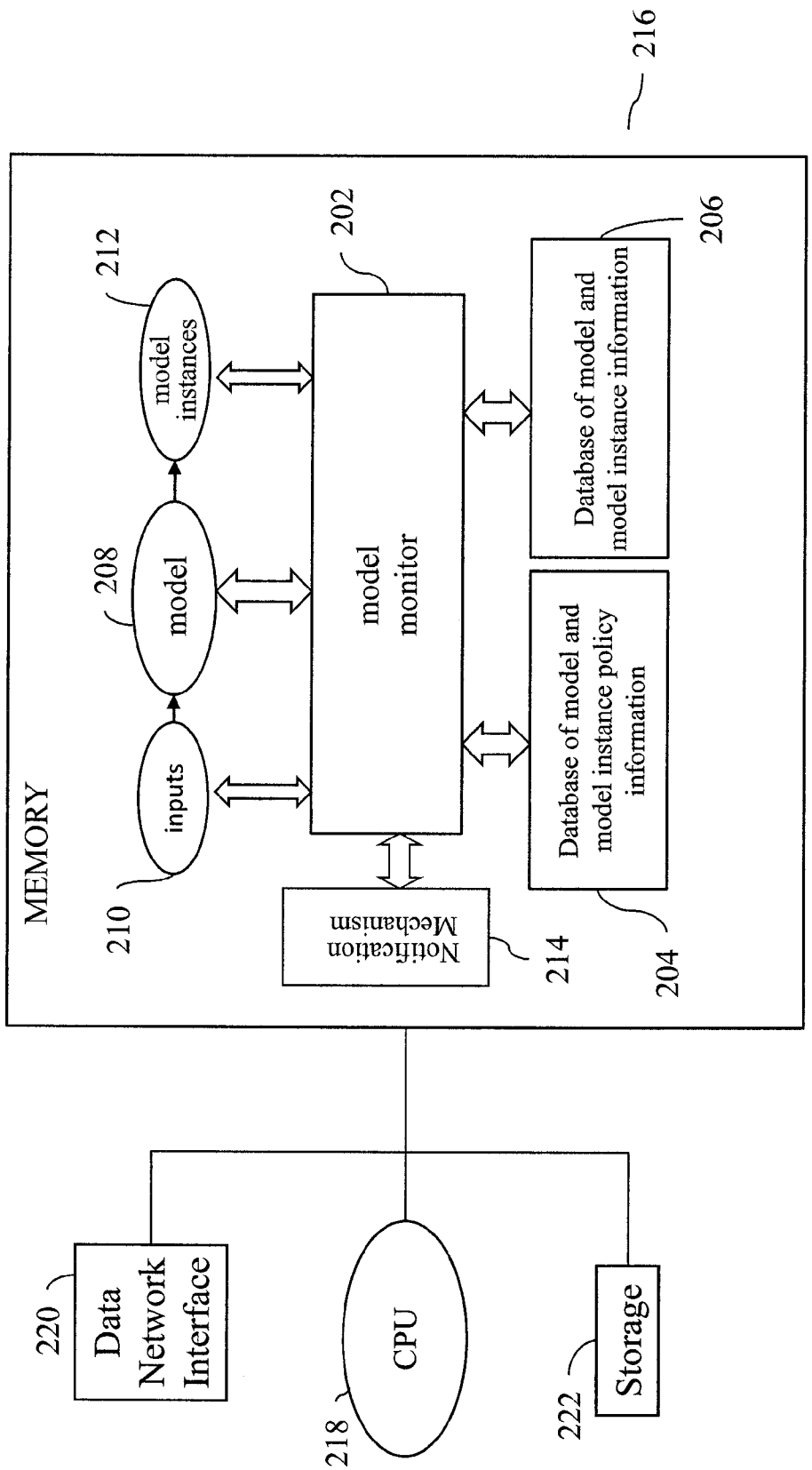
FIG. 2 illustrates a system for managing the governance of analytic models, its functional components and model instances in one embodiment.

FIG. 2 illustrates a system for managing the governance of analytic models and its functional components in one embodiment. The modules shown in FIG. 2 may be components of a computer system that may include any computing node that is able to load and execute programmatic code, for instance, running the operating system and server application suite. The system logic may be embodied as computer executable code that is loaded from a remote source (e.g., from a network file system), local permanent optical (CD-ROM), magnetic storage (such as disk), or storage 222 into memory 216 for execution by central processing unit (CPU) 218. A network interface 220 may be used for communicating to other network accessible services, for example an RSS feed or a web service. Such an interface 220 may include, but is not limited to a hardwired device, e.g., Ethernet over coax cable, wireless IP, and telephone to IP (VoIP), or others. The memory 216 may include computer readable instructions, data structures, program modules and application interfaces providing logic or functional components for model governance.

It should be understood that while FIG. 2 illustrates the functional components residing in a computer system component 216, the system and method of the present disclosure is not limited to only that configuration. Thus, the components (or various parts of the components) may be distributed over a network on different platforms in a distributed environment, and/or configured in a cloud computing environment. Further, while FIG. 2 shows a CPU 218, the system may include multiple processors and/or cores.

Information about one or more models may be collected and maintained in a database of information 206. The information as described above may specify one or more attributes and data associated with or used by the model, and conditions in which the results produced by the model would no longer be valid or reliable. The information may be pre-established based on the previous knowledge and theory about the model. For example, a creator of the model may identify and store knowledge about the model, e.g., various data and parameters associated with the model, sensitivity of the model to certain parameters and data used in the model, types of output of the model, and other information about the model.

Information about model instances of one or models may be collected and maintained in a database of information 206. The information may include, but is not limited to, when the model instance was created, the input data for the model instance, valid data ranges for each input, and what programs or users are dependent on the model instance results.

In one aspect, the information describing the model may be recorded or stored in a format, for example, readable and accessible to the model monitor 202. An example format may be the predictive model markup language (PMML). Markup languages such as extensible markup language (XML) may be used to define a formal syntax for capturing the necessary semantics for describing the model. Any non-markup format may be employed. As such, in another aspect, a standard for describing or defining analytic models may be provided in this disclosure. The standard may be utilized by each creator of the model or those who know about the model, and also the automatic governance system of the present disclosure.

Information describing policies of model and model instance (also referred to as model and model instance policies), described above, may be recorded or stored likewise in a format, for example, readable and accessible to the model monitor 202. A policy/rule language such as Semantics of Business Vocabulary and Business Rules (SBVR) can be used to represent the policy information. Other Markup languages such as XML or a non-markup format can be used to represent the model and model instance policy information.

A model monitor 202 monitors and evaluates a model 208 (e.g., an analytical model) and its inputs 210 on an ongoing basis, for example, continuously or periodically to ensure the valid use of the 208. For example, the model monitor 202 retrieves information 206 associated with the model such as valid input range, sensitivity to one or more parameters, output type, update history, and others. The model monitor 202 also retrieves policy information 204 about the model. The model monitor evaluates the policies using the model information and the current model inputs to determine if actions need to be taken. Actions taken by the model monitor 202 is based on the policy information 204 it has retrieved. For example, a model may be valid only for a defined range of inputs. Using the policies/rules, the model monitor 202 may provide ongoing assessment of the model inputs 210. If the model monitor 202 detects that the inputs are outside the defined range, the model monitor 202 can take an action specified in the policy, such as sending a notification (event) to a notification system 214, which in turn, can notify a user or another system component. For a second example of model monitoring, the model monitor 202 can validate whether the analytic element of a model to be evaluated as part of a model is current and has not been modified by an unauthorized user. If either of the conditions is false, a notification can be sent. For a third example of model monitoring, based on policy, the model monitor 202 could substitute one model for another, for example, for a given input, a model using classification tree may be substituted for a logistic model if a higher degree of accuracy is required.

Likewise, the model monitor 202 monitors and evaluates model instances 212 of a given model 208. For example, the model monitor 202 may check the currency of the model instances to determine whether the model instance is old or has one or more input changed by more than a specific percentage. The model monitor 202 retrieves model instance information 206 and model instance policy information 204 and uses the information with the current inputs of the model 208 used to create the model instances to determine the validity of the model instances. For example, the model instance policy might state that all model instances older than 5 days should be invalidated and the model should be reevaluated using current inputs (creating new model instances). If other models are dependent on the output of any model instance to be invalidated (the list of these models can be obtained from the model instance information 206), the model monitor may examine those models to determine how the invalidated instance may affect those models. The actions taken by the model monitor 202 are based on the model instance policy information 204. For example, the policy might state that all models instances that use the output of an invalidated model instance should be invalidated and reevaluated based on current inputs.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Figure 3:
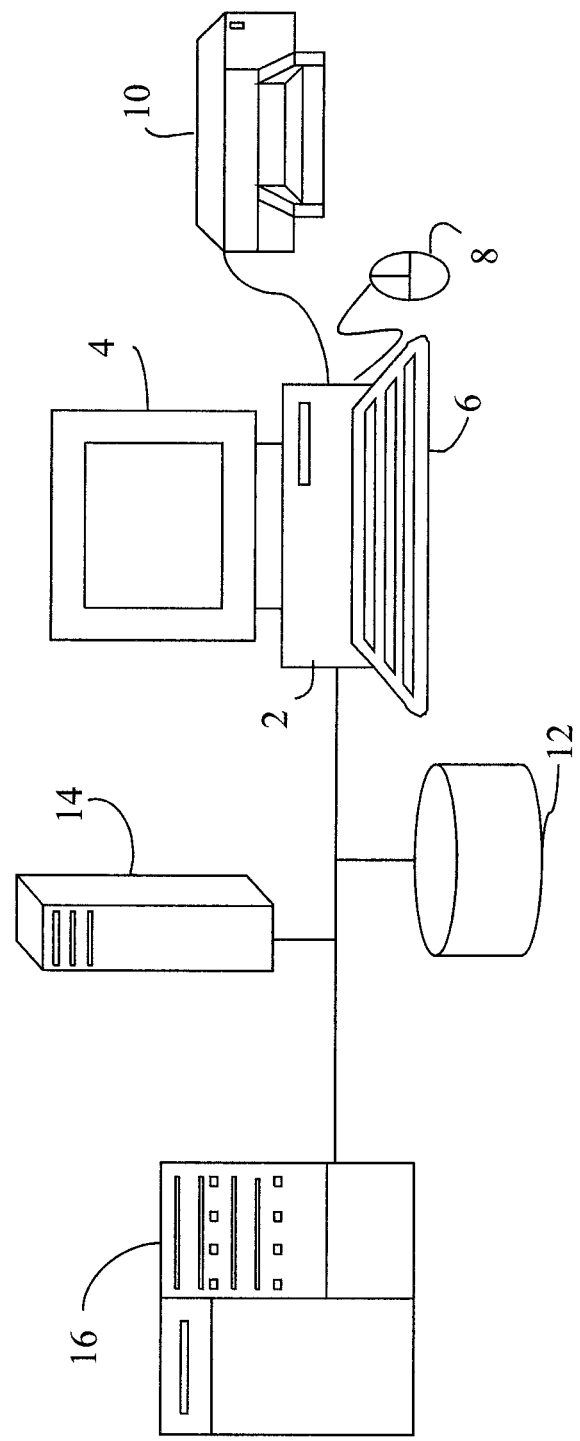
FIG. 3 illustrates an example of a computer system, in which the systems and methodologies of the present disclosure may be carried out or executed.

Referring now to FIG. 3, the systems and methodologies of the present disclosure may be carried out or executed in a computer system that includes a processing unit 2, which houses one or more processors and/or cores, memory and other systems components (not shown expressly in the drawing) that implement a computer processing system, or computer that may execute a computer program product. The computer program product may comprise media, for example a hard disk, a compact storage medium such as a compact disc, or other storage devices, which may be read by the processing unit 2 by any techniques known or will be known to the skilled artisan for providing the computer program product to the processing system for execution.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The computer processing system that carries out the system and method of the present disclosure may also include a display device such as a monitor or display screen 4 for presenting output displays and providing a display through which the user may input data and interact with the processing system, for instance, in cooperation with input devices such as the keyboard 6 and mouse device 8 or pointing device. The computer processing system may be also connected or coupled to one or more peripheral devices such as the printer 10, scanner (not shown), speaker, and any other devices, directly or via remote connections. The computer processing system may be connected or coupled to one or more other processing systems such as a server 10, other remote computer processing system 14, network storage devices 12, via any one or more of a local Ethernet, WAN connection, Internet, etc. or via any other networking methodologies that connect different computing systems and allow them to communicate with one another. The various functionalities and modules of the systems and methods of the present disclosure may be implemented or carried out distributedly on different processing systems (e.g., 2, 14, 16), or on any single platform, for instance, accessing data stored locally or distributedly on the network.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The computer system may be any type of known or will be known systems and may typically include a processor, memory device, a storage device, input/output devices, internal buses, and/or a communications interface for communicating with other computer systems in conjunction with communication hardware and software, etc.

The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A method for governing a modeling system, comprising:
    collecting information associated with an analytic model and one or more instances of the analytic model;
    defining one or more policies associated with the analytic model;
    defining one or more policies associated with the one or more instances of the analytic model; and
    monitoring automatically, using a processor, the analytic model and the one or more instances of the analytic model, the monitoring comprising monitoring over time, at least some of the collected information, the one or more policies associated with the analytic model and the one or more policies associated with the one or more instances of the analytic model,
    the analytic model comprising at least an analytic component and metadata comprising description of an analytic technique used by the analytic model wherein the analytic technique comprises at least one of mathematical modeling, statistical modeling, and data mining,
    the collected information associated with the analytic model comprising at least a model name, author, model version, description, result description, parameter values, and model sensitivity to one or more changes in one or more of the parameter values, names and descriptions of model input variables, names and descriptions of model output variables, and design criteria comprising at least types of input for which the analytic model is designed, wherein the monitoring automatically detects one or more conditions in which one or more results produced by the one or more instances of the analytic model are no longer valid, the one or more conditions comprising at least a change in one or more model assumptions based on which the analytic model is built, the one or more conditions detected further based on the sensitivity to one or more changes in one or more of the parameter values, and in response automatically updates the one or more instances of the analytic model, the automatically updating comprising one or more of editing an analytic element of the analytic model, replacing the analytic element of the model, or combinations thereof, and in response to detecting that the types of input for which the analytic model is designed has changed based on automatic monitoring, automatically selecting a different analytic model that produces more accurate result to replace the analytic model, and generating and sending an event signal to a component that relies on the analytic model, wherein the automatically selecting a different analytic model that produces more accurate result to replace the analytic model comprises substituting a classification tree based model for a logistic model.

2. The method of claim 1, wherein the one or more policies associated with the analytic model includes a policy for assessing validity of analytic procedure, a policy for selecting a model given output requirements, a policy for specifying valid inputs to a model, a policy for replacing a model, a policy for updating elements associated with the analytic model, or combinations thereof.

3. The method of claim 1, wherein the one or more policies associated with the one or more instances of the analytic model includes a policy specifying criteria for invalidating said one or more instances of the analytic model.

4. The method of claim 1, wherein one or more policies associated with the analytic model and the one or more policies associated with the one or more instances of the analytic model further include one or more actions for implementing the one or more policies.

5. The method of claim 1, wherein the one or more policies associated with the analytic model and one or more policies associated with the one or more instances of the analytic model are updated over time as needed.

6. The method of claim 1, wherein the collected information is stored in a structured data format.

7. The method of claim 1, wherein the collected information is stored in a marked up language.

8. A system for governing analytic models, comprising:
a processor;
a storage device operable to store information associated with an analytic model and one or more instances of the analytic model, the storage device further operable to store one or more policies associated with the analytic model and one or more policies associated with one or more instances of the analytic model; and
monitoring module operable to automatically monitor the analytic model and the one or more instances of the analytic model by monitoring over time at least some of the stored information, the one or more policies associated with the analytic model and the one or more policies associated with the one or more instances of the analytic model, the analytic model comprising at least an analytic component and metadata comprising description of an analytic technique used by the analytic model wherein the analytic technique comprises at least one of mathematical modeling, statistical modeling, and data mining, the collected information associated with the analytic model comprising at least a model name, author, model version, description, result description, parameter values, and model sensitivity to one or more changes in one or more of the parameter values, names and descriptions of model input variables, names and descriptions of model output variables, and design criteria comprising at least types of input for which the analytic model is designed, wherein the monitoring module automatically detects one or more conditions in which one or more results produced by the one or more instances of the analytic model are no longer valid, the one or more conditions comprising at least a change in one or more model assumptions based on which the analytic model is built, the one or more conditions detected further based on the sensitivity to one or more changes in one or more of the parameter values, and in response automatically updates the one or more instances of the analytic model, the automatically updating comprising one or more of editing an analytic element of the analytic model, replacing the analytic element of the model, or combinations thereof, and in response to detecting that the types of input for which the analytic model is designed has changed based on automatic monitoring, automatically selecting a different analytic model that produces more accurate result to replace the analytic model, and generating and sending an event signal to a component that relies on the analytic model, wherein the automatically selecting a different analytic model that produces more accurate result to replace the analytic model comprises substituting a classification tree based model for a logistic model.

9. The system of claim 8, wherein the one or more policies associated with the analytic model includes a policy for assessing validity of analytic procedure, a policy for selecting a model given output requirements, a policy for specifying valid inputs to a model, a policy for replacing a model, a policy for updating elements associated with the analytic model, or combinations thereof.

10. The system of claim 8, wherein the one or more policies associated with the one or more instances of the analytic model includes a policy specifying criteria for invalidating said one or more instances of the analytic model.

11. The system of claim 8, wherein one or more policies associated with the analytic model and the one or more policies associated with the one or more instances of the analytic model further include one or more actions for implementing the one or more policies.

12. The system of claim 8, wherein the one or more policies associated with the analytic model and one or more policies associated with the one or more instances of the analytic model are updated over time as needed.

13. The system of claim 8, wherein the collected information is stored in a structured data format.

14. The system of claim 8, wherein the collected information is stored in a marked up language.

15. A computer readable storage medium, excluding a signal per se, storing a program of instructions executable by a processor to perform a method of governing a model, the method comprising:
collecting information associated with an analytic model and one or more instances of the analytic model;
defining one or more policies associated with the analytic model;
defining one or more policies associated with the one or more instances of the analytic model; and
monitoring, using a processor, the analytic model and the one or more instances of the analytic model, the monitoring comprising monitoring over time, at least some of the collected information, the one or more policies associated with the analytic model and the one or more policies associated with the one or more instances of the analytic model,
the analytic model comprising at least an analytic component and metadata comprising description of an analytic technique used by the analytic model wherein the analytic technique comprises at least one of mathematical modeling, statistical modeling, and data mining,
the collected information associated with the analytic model comprising at least a model name, author, model version, description, result description, parameter values, and model sensitivity to one or more changes in one or more of the parameter values, names and descriptions of model input variables, names and descriptions of model output variables, and design criteria comprising at least types of input for which the analytic model is designed,
wherein the monitoring automatically detects one or more conditions in which one or more results produced by the one or more instances of the analytic model are no longer valid, the one or more conditions comprising at least a change in one or more model assumptions based on which the analytic model is built, the one or more conditions detected further based on the sensitivity to one or more changes in one or more of the parameter values,
and in response automatically updates the one or more instances of the analytic model, the automatically updating comprising one or more of editing an analytic element of the analytic model, replacing the analytic element of the model, or combinations thereof,
and in response to detecting that the types of input for which the analytic model is designed has changed based on automatic monitoring, automatically selecting a different analytic model that produces more accurate result to replace the analytic model, and generating and sending an event signal to a component that relies on the analytic model, wherein the automatically selecting a different analytic model that produces more accurate result to replace the analytic model comprises substituting a classification tree based model for a logistic model.

16. The computer readable storage medium of claim 15, wherein the one or more policies associated with the analytic model includes a policy for assessing validity of analytic procedure, a policy for selecting a model given output requirements, a policy for specifying valid inputs to a model, a policy for replacing a model, a policy for updating elements associated with the analytic model, or combinations thereof.

17. The computer readable storage medium of claim 15, wherein the one or more policies associated with the one or more instances of the analytic model includes a policy specifying criteria for invalidating said one or more instances of the analytic model.

18. The computer readable storage medium of claim 15, wherein one or more policies associated with the analytic model and the one or more policies associated with the one or more instances of the analytic model further include one or more actions for implementing the one or more policies.

19. The computer readable storage medium of claim 15, wherein the one or more policies associated with the analytic model and one or more policies associated with the one or more instances of the analytic model are updated over time as needed.

20. The computer readable storage medium of claim 15, wherein the collected information is stored in a structured data format.

21. The computer readable storage medium of claim 15, wherein the collected information is stored in a marked up language.

* * * * *